United States Patent
Bajdechi et al.

(10) Patent No.: US 7,859,338 B2
(45) Date of Patent: Dec. 28, 2010

(54) COMPACT LOW-POWER CLASS AB AMPLIFIER

(75) Inventors: Ovidiu Bajdechi, Santa Clara, CA (US); Christopher Michael Ward, Utrecht (NL)

(73) Assignee: Broadcom Corporation, Irvine, CA (US)

( * ) Notice: Subject to any disclaimer, the term of this patent is extended or adjusted under 35 U.S.C. 154(b) by 29 days.

(21) Appl. No.: 12/177,523

(22) Filed: Jul. 22, 2008

(65) Prior Publication Data

US 2009/0027122 A1    Jan. 29, 2009

Related U.S. Application Data

(60) Provisional application No. 60/935,097, filed on Jul. 26, 2007.

(51) Int. Cl.
*H03F 3/45* (2006.01)
(52) U.S. Cl. ..................... 330/253
(58) Field of Classification Search ............... 330/253, 330/257
See application file for complete search history.

(56) References Cited

U.S. PATENT DOCUMENTS

| | | | | |
|---|---|---|---|---|
| 5,748,040 A | * | 5/1998 | Leung | 330/253 |
| 5,907,259 A | * | 5/1999 | Yamada et al. | 327/563 |
| 7,358,812 B2 | * | 4/2008 | Portmann et al. | 330/255 |
| 7,557,658 B2 | * | 7/2009 | Perez | 330/255 |

* cited by examiner

*Primary Examiner*—Robert Pascal
*Assistant Examiner*—Khiem D Nguyen
(74) *Attorney, Agent, or Firm*—Sterne Kessler Goldstein & Fox, P.L.L.C.

(57) ABSTRACT

A compact low-power class AB power amplifier design is provided. In an embodiment, the amplifier design eliminates an intermediate stage that couples an input stage and a biasing mesh of the amplifier. In another embodiment, the amplifier design reuses a tail current from the input stage to bias the biasing mesh. Accordingly, a much higher power efficiency can be achieved using the proposed amplifier design compared to conventional class AB amplifiers. Further, the proposed amplifier design is extremely compact and occupies a small silicon area.

20 Claims, 2 Drawing Sheets

COMPACT LOW-POWER CLASS AB AMPLIFIER

CROSS-REFERENCE TO RELATED APPLICATIONS

The present application claims the benefit of U.S. Provisional Patent Application No. 60/935,097, filed Jul. 26, 2007, which is incorporated herein by reference in its entirety.

BACKGROUND OF THE INVENTION

1. Field of the Invention

The present invention relates generally to power amplification.

2. Background Art

Class AB amplifiers are used in power-sensitive applications where the processed analog signals are characterized by a large crest factor (i.e., large ratio of peak value to root-mean-square (rms) value).

As opposed to class A amplifiers, class AB amplifiers have biasing currents that are signal-dependent. As such, when required by a large signal peak, they can source or sink tens of times more current than their quiescent bias currents.

One group of class AB amplifiers are the two-stage, Miller-compensated designs with a feedforward-biased class AB output stage and a class A input stage. These amplifiers have desirable characteristics, including large low-frequency gain, small output impedance, and a unity-gain bandwidth, which is not signal-dependent since the input stage transconductance is produced by a class A current.

However, with an output stage optimized for low power, the power dissipated by the class A input stage becomes important. There is a need therefore to reduce the power dissipated by the input stage.

BRIEF SUMMARY OF THE INVENTION

A compact low-power class AB power amplifier design is provided. In an embodiment, the amplifier design eliminates an intermediate stage that couples an input stage and a biasing mesh of the amplifier. Further, the amplifier design reuses a tail current from the input stage to bias the biasing mesh. Accordingly, a much higher power efficiency can be achieved using the proposed amplifier design compared to conventional class AB amplifiers. Further, the proposed amplifier design is extremely compact and occupies a small silicon area.

BRIEF DESCRIPTION OF THE FIGURES

Embodiments of the present invention will be described with reference to the accompanying drawings, wherein generally like reference numbers indicate identical or functionally similar elements. Also, generally, the leftmost digit(s) of the reference numbers identify the drawings in which the associated elements are first introduced.

DETAILED DESCRIPTION OF THE INVENTION

Figure 1:
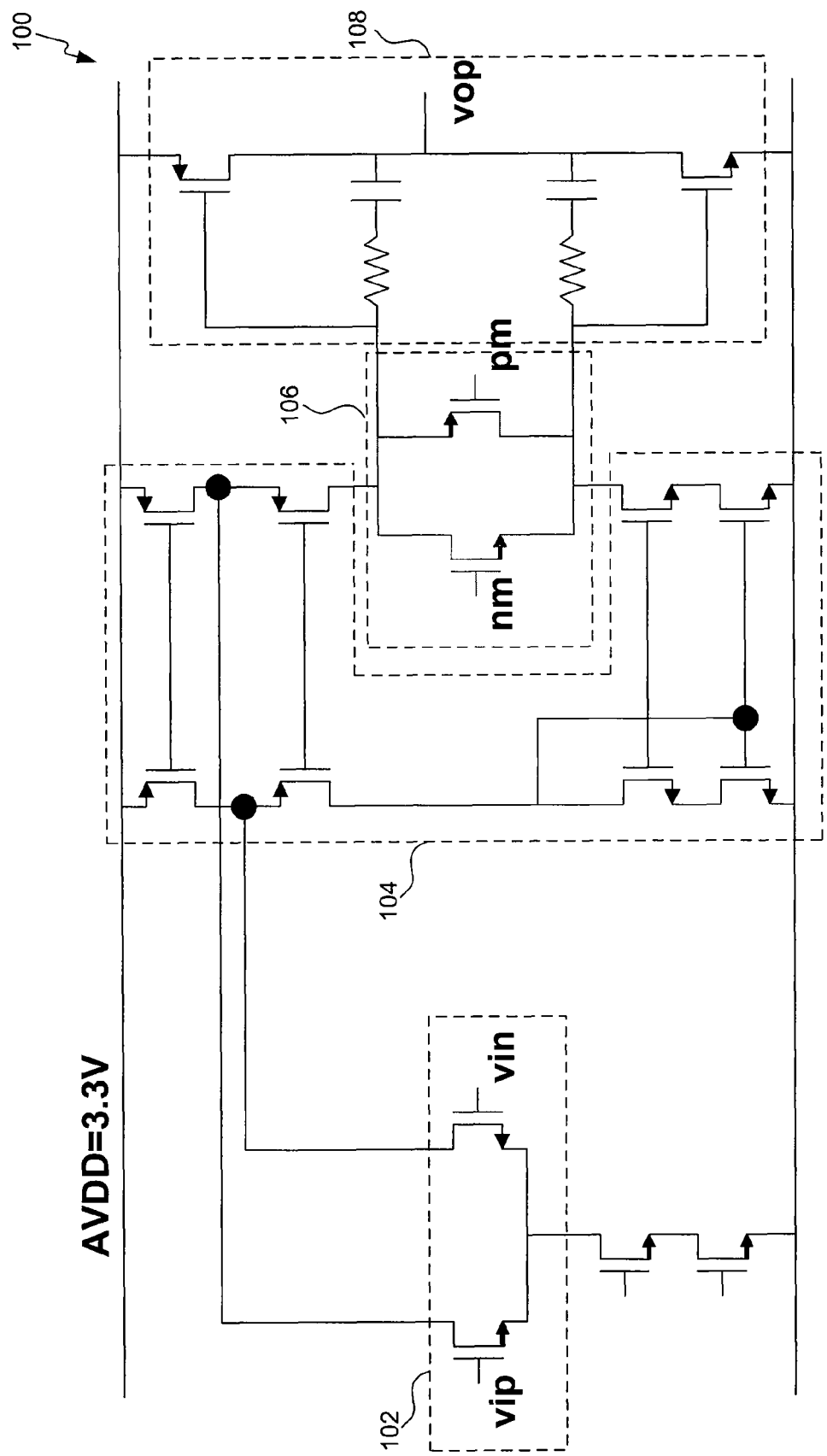
FIG. 1 illustrates an example class AB amplifier.

FIG. 1 illustrates an example class AB amplifier 100. Amplifier 100 includes an input stage 102, an intermediate stage 104, a class AB biasing mesh 106, and an output stage 108.

Input stage 102 couples to class AB biasing mesh 106 through intermediate stage 104. In an embodiment, intermediate stage 104 includes a folded-cascode, which helps improve the low-frequency gain of amplifier 100. Further, intermediate stage 104 supplies class AB biasing mesh 106 with two in-phase current signals that are also used to drive the gates of the NMOS and PMOS transistors of output stage 108.

Class AB biasing mesh 106 works by closing two translinear loops by means of biasing the "pm" and "nm" terminal nodes. In an embodiment, nodes "pm" and "nm" are biased using two voltages generated as the sum of two gate-to-source voltages.

In an embodiment, in quiescent state, the drain currents of the NMOS and PMOS transistors of biasing mesh 106 are equal. Accordingly, biasing mesh 106 biases output stage 108 at its quiescent current. Further, when input stage 102 is tilted (i.e., vip is pulled high and vin pulled low, or vice versa), the current signals drawn into and from the two ends of biasing mesh 106 remain equal and in-phase. As such, the total current in the NMOS and PMOS transistors of biasing mesh 106 does not change.

Biasing mesh 106, however, tilts when input stage 102 is tilted, with the ratio of the drain currents of the NMOS and PMOS transistors of biasing mesh 106 changing according to changes in input stage voltages vip and vin. In turn, output stage 108 also tilts to either sink or source current. For example, when current increases in the NMOS transistor of output stage 108, current decreases in the PMOS transistor of output stage 108. In an embodiment, the PMOS transistor is designed to continue to drive a minimum current in the fully-tilted state, so that the amplifier can rapidly recover from that state.

For large-bandwidth amplifiers, intermediate stage 104 supplies biasing mesh 106 with DC current and the two in-phase current signals, as described above. However, the power consumption in intermediate stage 104 is at least two times the power of input stage 102 for slew-rate and linearity reasons. This results in significant power being wasted in intermediate stage 104 without actual improvement of amplifier performance.

Figure 2:
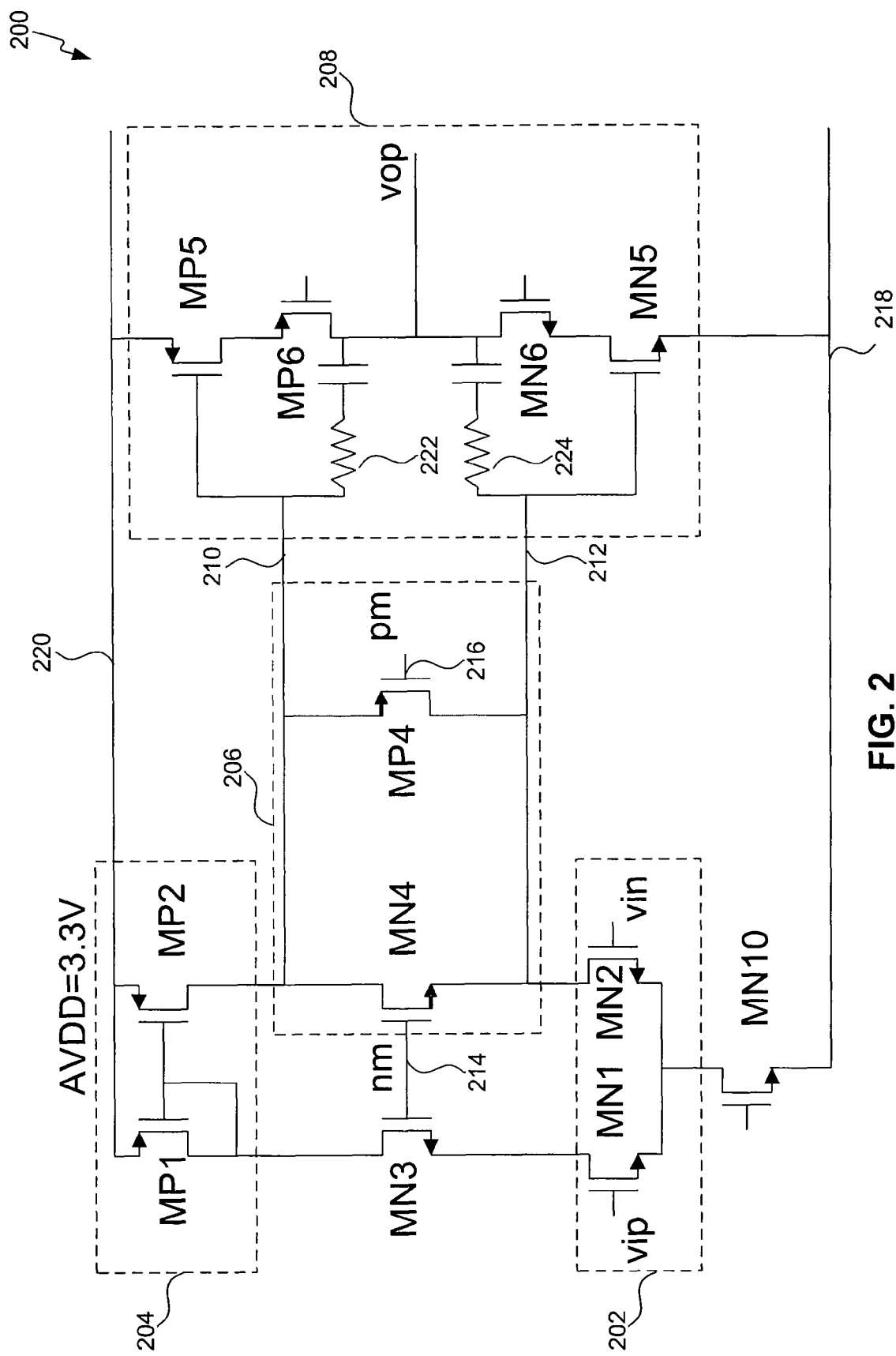
FIG. 2 illustrates an example low power class AB amplifier according to an embodiment of the present invention.

FIG. 2 illustrates an example low power class AB amplifier 200 according to an embodiment of the present invention. Amplifier 200 includes an input stage 202, a current mirror 204, a class AB biasing mesh 206, and an output stage 208.

In an embodiment, all biasing currents are used to generate gain in amplifier 200.

Accordingly, input stage 202, which includes NMOS transistors MN1-MN2, is biased by a tail current source MN10. As such, the current signals at the drain terminals of NMOS transistors MN1 and MN2 of input stage 202 are in opposite phase. Further, the drain terminals of transistors MN1 and MN2 are biased at equal voltages by transistors MN3 and MN4.

Current mirror 204 (MP1-MP2) inverts the phase of the current signal at the drain of transistor MN4, which is the same as the current signal at the drain of transistor MN1. This current signal is then used to drive class-AB biasing mesh 206 (MN4-MP4) by coupling it between the drain terminal of transistor MN2 and the drain terminal of transistor MP2. The two ends 210 and 212 of biasing mesh 206 are coupled respectively to the gate terminals of output transistors MP5 and MN5 to properly bias output stage 208 in class AB mode by use of two translinear loops from node nm 214 to ground 218 and from node pm 216 to AVDD 220. In an embodiment, as shown in FIG. 2, output transistors MP5 and MN5 are also cascoded with transistors MP6 and MN6 to enhance their output impedance, and the amplifier is Miller-compensated using two RC networks 222 and 224.

Accordingly, the two in-phase output currents of input stage 202 are directly coupled to the two ends 210 and 212 of biasing mesh 206, without having to incur the delay of an intermediate stage.

The direct coupling of input stage 202 and biasing mesh 206 improves the phase margin of amplifier 200 when placed in a feedback configuration. Furthermore, no additional current is needed for biasing mesh 206, which is always as fast as the input stage.

Further, by directly coupling input stage 202 and output stage 208 with class-AB biasing mesh 206 driven at both ends and by re-using the input stage tail current for biasing mesh 206, a much higher power efficiency can be achieved compared to conventional class AB amplifiers. In addition, the design is made extremely compact and occupies a small silicon area.

Further still, because an NMOS transistor, MN2, is used to drive a second-stage NMOS transistor, MN5, with identical threshold voltage, the common-mode input range is lower compared to conventional amplifiers. The feedback around the amplifier can be used to implement the common-mode shifts as required by the application.

In an embodiment, a transistor, MN3, is placed as a cascode for input stage transistor MN1 to maintain the input stage balanced by providing equal drain-to-source voltages to MN1 and MN2.

In another embodiment, when amplifier 200 is powered by a 3.3V supply, 1V-tolerant transistors can be used in certain parts of the circuit to take advantage of their small size and higher speed. For example, 1-V tolerant transistors can be used for the amplifying transistors in the output stage (MN5 and MP5) and the input stage (MN1 and MN2). This provides small gate-to-source parasitic capacitance and large transconductance to these transistors, both of which help reduce the power in the class-A biased input stage. However, where 1V-tolerant transistors are used, care should be taken not to drive these transistors beyond their voltage limit. For the input stage, this can be achieved by design and/or by using transistor MN3. For the output stage, protection for 1-V tolerant transistors can be implemented by using thick-oxide (2.5V or 3.3V) devices for cascode transistors MN6 and MP6 to prevent the drain terminals of thin-oxide devices MN5 and MP5 from reaching higher than 1V from their respective source terminals.

CONCLUSION

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. An amplifier, comprising:
    an input stage, including first and second transistors, that receives a differential input signal and generates first and second current signals;
    a current minor circuit, coupled to said input stage circuit, that inverts the phase of said first current signal; and
    a biasing mesh circuit, having first and second terminals, that receives said inverted-phase first current signal and said second current signal directly at said first and second terminals respectively and biases an output stage of said amplifier;
    wherein said biasing mesh circuit is coupled to said input stage and to said output stage, without intervening circuitry.

2. The amplifier of claim 1, wherein said first and second current signals have opposite phases.

3. The amplifier of claim 1, wherein said input stage is biased to operate in class A mode using a bias current generated by a tail current source.

4. The amplifier of claim 3, wherein said tail current source is coupled between a common source terminal of said first and second transistors and a ground node.

5. The amplifier of claim 1, wherein said first and second transistors of said input stage are source-coupled, and wherein drain terminals of said first and second transistors are biased at equal voltages.

6. The amplifier of claim 1, wherein a cascode transistor is coupled to said first transistor of said input stage to ensure balanced biasing of said first and second transistors.

7. The amplifier of claim 1, wherein said biasing mesh circuit couples directly to said output stage at said first and second terminals, thereby ensuring that said input stage and said output stage are directly coupled with no intermediate circuitry therebetween.

8. The amplifier of claim 1, wherein said output stage includes third and fourth transistors, and wherein said first and second terminals of said biasing mesh circuit couple respectively to gate terminals of said third and fourth transistors.

9. The amplifier of claim 8, wherein said output stage further includes first and second RC networks coupled respectively between the drain and gate terminals of said third and fourth transistors, thereby providing a Miller-compensated output stage.

10. The amplifier of claim 1, wherein said biasing mesh circuit biases said output stage to operate in class AB mode.

11. The amplifier of claim 1, wherein said biasing mesh circuit is directly coupled to said input stage, thereby improving the phase margin of said amplifier.

12. The amplifier of claim 1, wherein said output stage includes third and fourth transistors, and wherein said output stage further includes first and second cascode transistors coupled respectively to said third and fourth transistors, thereby enhancing the output impedance of said amplifier.

13. The amplifier of claim 12, wherein said output stage further includes first and second RC networks coupled respectively between the drain terminals of said first and second cascode transistors and the gate terminals of said third and fourth transistors, thereby providing a Miller-compensated cascoded output stage.

14. The amplifier of claim 1, wherein said output stage includes third and fourth transistors, and wherein said output stage further includes first and second RC networks coupled respectively between the drain and gate terminals of said third and fourth transistors, thereby providing a Miller-compensated output stage.

15. The amplifier of claim 1, wherein said first and second transistors of said input stage are NMOS transistors.

16. The amplifier of claim 15, wherein said output stage includes third and fourth transistors, wherein said third transistor is a PMOS transistor and said fourth transistor is an NMOS transistor.

17. The amplifier of claim 16, wherein said second and fourth transistors have identical threshold voltages, thereby lowering the common-mode input range of said amplifier.

18. The amplifier of claim 1, wherein said first and second transistors are 1-V tolerant transistors with low gate-to-source parasitic capacitance and large transconductance, thereby reducing power in said input stage.

19. The amplifier of claim 1, wherein one or more transistors of said output stage are 1-V tolerant transistors with low gate-to-source parasitic capacitance and large transconductance.

20. The amplifier of claim 12, wherein said third and fourth transistors are 1-V tolerant transistors and said first and second cascode transistors are thick-oxide transistors, thereby protecting said third and fourth transistors from drain to source breakdown.

* * * * *

UNITED STATES PATENT AND TRADEMARK OFFICE
CERTIFICATE OF CORRECTION

| | | |
|---|---|---|
| PATENT NO. | : 7,859,338 B2 | Page 1 of 1 |
| APPLICATION NO. | : 12/177523 | |
| DATED | : December 28, 2010 | |
| INVENTOR(S) | : Bajdechi et al. | |

It is certified that error appears in the above-identified patent and that said Letters Patent is hereby corrected as shown below:

Column 3, line 64, "a current minor circuit," should be replaced with --a current mirror circuit,--.

Signed and Sealed this
Twenty-second Day of March, 2011

David J. Kappos
*Director of the United States Patent and Trademark Office*